US006734683B2

(12) United States Patent
Hash

(10) Patent No.: US 6,734,683 B2
(45) Date of Patent: May 11, 2004

(54) METHOD AND APPARATUS FOR IN-CIRCUIT TESTING OF SOCKETS

(75) Inventor: Robert C. Hash, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 09/963,389

(22) Filed: Sep. 27, 2001

(65) Prior Publication Data

US 2003/0057981 A1 Mar. 27, 2003

(51) Int. Cl.[7] .................. H01H 31/04; H01H 31/02
(52) U.S. Cl. ........................ 324/538; 324/537
(58) Field of Search ..................... 324/555, 537, 324/763, 754, 761, 538, 755, 72

(56) References Cited

U.S. PATENT DOCUMENTS

| 5,811,977 A | * | 9/1998 | Rouchaud ............ 324/538 |
| 6,291,978 B1 | | 9/2001 | Chandler et al. |

FOREIGN PATENT DOCUMENTS

| EP | 1 022 571 A2 | 7/2000 | |
| JP | 57-204459 | * 12/1982 | ............ G01R/1/06 |
| JP | 6 212 0647 | 6/1987 | |
| JP | 6 222 3679 | 10/1987 | |

* cited by examiner

*Primary Examiner*—David A. Zarnecke
*Assistant Examiner*—Paresh Patel
(74) *Attorney, Agent, or Firm*—Schwegman, Lundberg, Woessner & Kluth, P.A.

(57) ABSTRACT

Method and apparatus for in-circuit socket testing that includes a module, a printed circuit board, and a test fixture. The module contains two or more switching devices. The module is electrically attachable to a socket. The printed circuit board contains a footprint for insertion of all pins of the socket. The test fixture is electrically connected to all pins of the socket through the printed circuit board. The test fixture supplies power and ground to power pins and ground pins of the socket. Open connections to pins of the socket are detected by monitoring the pins after connecting a signal pin to a ground pin through one switching devices or connecting the signal pin to a power pin through a second switching device.

4 Claims, 3 Drawing Sheets

METHOD AND APPARATUS FOR IN-CIRCUIT TESTING OF SOCKETS

BACKGROUND

FIELD OF THE INVENTION

This invention relates to in-circuit testing of sockets, and more specifically to in-circuit testing of any opens on all pins of a socket, including hard to see pins such as pins in ball grid array sockets.

BACKGROUND INFORMATION

Computers and other electronic devices have undergone steady advances in technology. Processors, the heart of most computers, are being developed that operate at faster and faster speeds. This is due in part to the die size of processors and other electronic devices decreasing. The technology of processor sockets has also evolved. Processor socket mounting has evolved from through board pins to surface mounting such as with a ball grid array socket.

Surface mount technology, such as ball grid arrays, present challenges from a manufacturing point of view. With ball grid array technology, visual inspection of the solder joints is not possible. Open solder joints of any of the signal pins may result in the attached processor malfunctioning, or failing to boot altogether. Opens on the power pins or ground pins may cause a processor to malfunction under heavy load, or may cause hot spots due to excessive current in the connected power and ground pins.

Since visual inspection of the solder joints on a ball grid array attached to a printed circuit board is not possible, other methods are currently used to check the ball grid array connections. Currently, the processor or other electronic device, being plugged into a surface mount ball grid array socket, may include registers on the input/output signals of the die. These are commonly called boundary scan registers, and allow testing of signal lines coming into and leaving the die. Boundary scan testing generally exercises signal pins, but not power and ground pins independently. Therefore, there is no pin-by-pin granularity during boundary scan testing. Further, boundary scan testing may not test all signal pins. This may be because all input/output signal pins may not have a boundary scan register associated with it.

In standard in-circuit testing, where all components/devices may be populated and powered up on a printed circuit board/motherboard, test routines usually exist for bridging and shorts between pins. Test points on the motherboard allow for the connection of probes from a high-end tester allowing for the checking of bridging and shorts. The high-end testers (e.g., HP3070, GENRAD machines, etc.), supply power and ground to the motherboard and, therefore, to the sockets and/or devices populated on the motherboard. However, current in-circuit testing does not provide adequate testing of open connections on signal pins, power pins, or ground pins between a surface mounted socket and a printed circuit board.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

Figure 1:
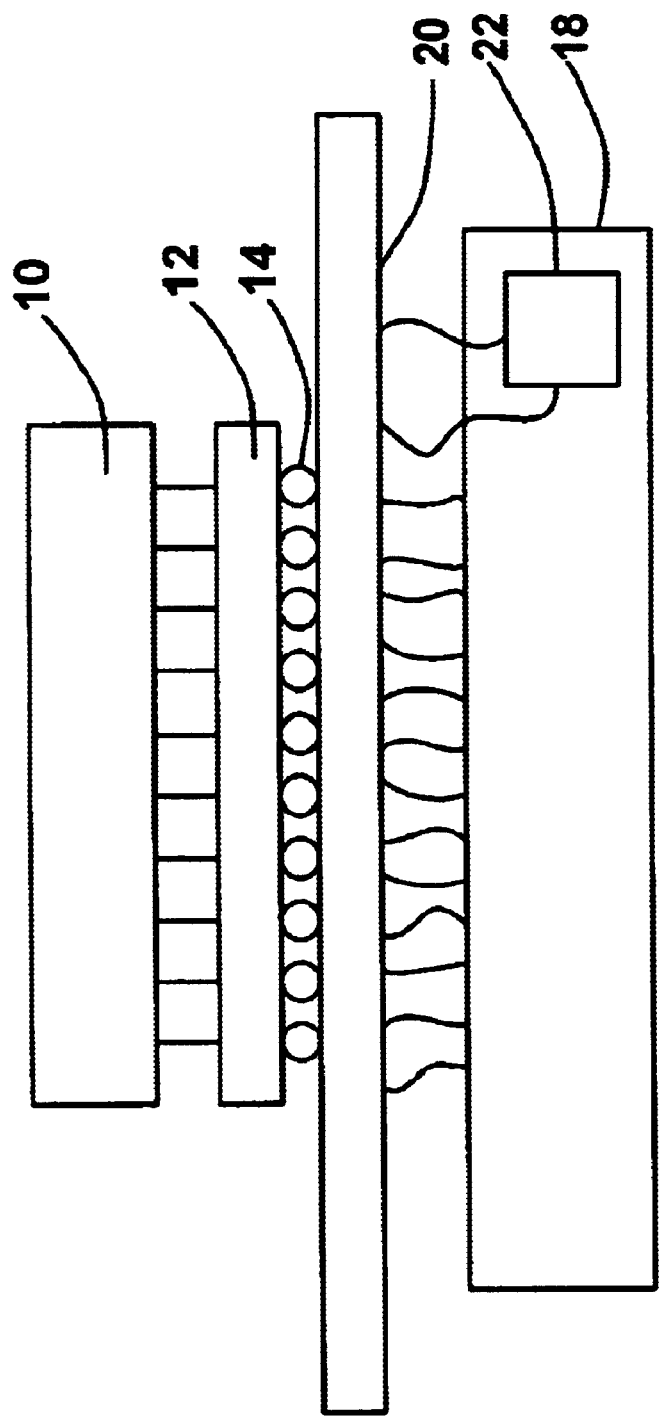
FIG. 1 is a block diagram of a system for in-circuit socket testing according to an example embodiment of the present invention.

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to method and apparatus for in-circuit test of sockets. A test module, that includes pairs of switching devices, may be attached to a socket to be tested and all open connections on each signal pin, power pin, and ground pin of the socket detected. All pins on the test module may be electrically isolated from each other. Each pair of switching devices is used to connect a signal line of the socket to power and ground. Using the pair of switching devices, all open connections between a socket and a printed circuit board the socket is attached to can be detected. In methods and apparatus according to the present invention, boundary scan capability is not required, and all types of sockets and connectors (including surface mount) where a boundary scan device is not readily available may be tested. The term 'pins' is used to denote the conductive devices part of the socket that make electrical connection with a printed circuit board.

The switching device may be any type device capable of connecting/disconnecting two signal lines. FETs as the switching devices will be used to illustrate the present invention, however, the present invention is not limited to using FETs as the switching devices, and any switching device that is within the spirit and scope of the present invention may be used according to the present invention. One FET of the pair connects a single signal pin of the socket to a single power pin when activated, and the other FET in the pair, when activated, connects the same signal pin to a single ground pin. Multiple FET pairs may be used to connect all signal pins to independent power and ground pins.

FIG. 1 shows a block diagram of a system for in-circuit socket testing according to an example embodiment of the present invention. The system includes a socket 12 that is electrically connected to a motherboard or printed circuit board 16 via ball grid array or other type pins 14. Generally, the pins 14 of socket 12 are soldered onto printed circuit board 16. A test module 10 attaches to all pins of socket 12. A test fixture 18 may be connected to every node or trace on the printed circuit board 16 via test points 20. Further, test fixture 18 may be a "bed of nails" fixture where printed circuit board 16 lies on top of a portion of test fixture 18 to make the electrical connections. Test fixture 18 may be any type of high-end tester or low-end tester, for example, HP3070, GENRAD machines, etc. Test fixture 18 may include a power supply 22 that provides power and ground signals to socket 12 through printed circuit board 16, or power and ground may be supplied external to test fixture 18. Test fixture 18 may be used to control the testing and monitor the results.

Figure 2:
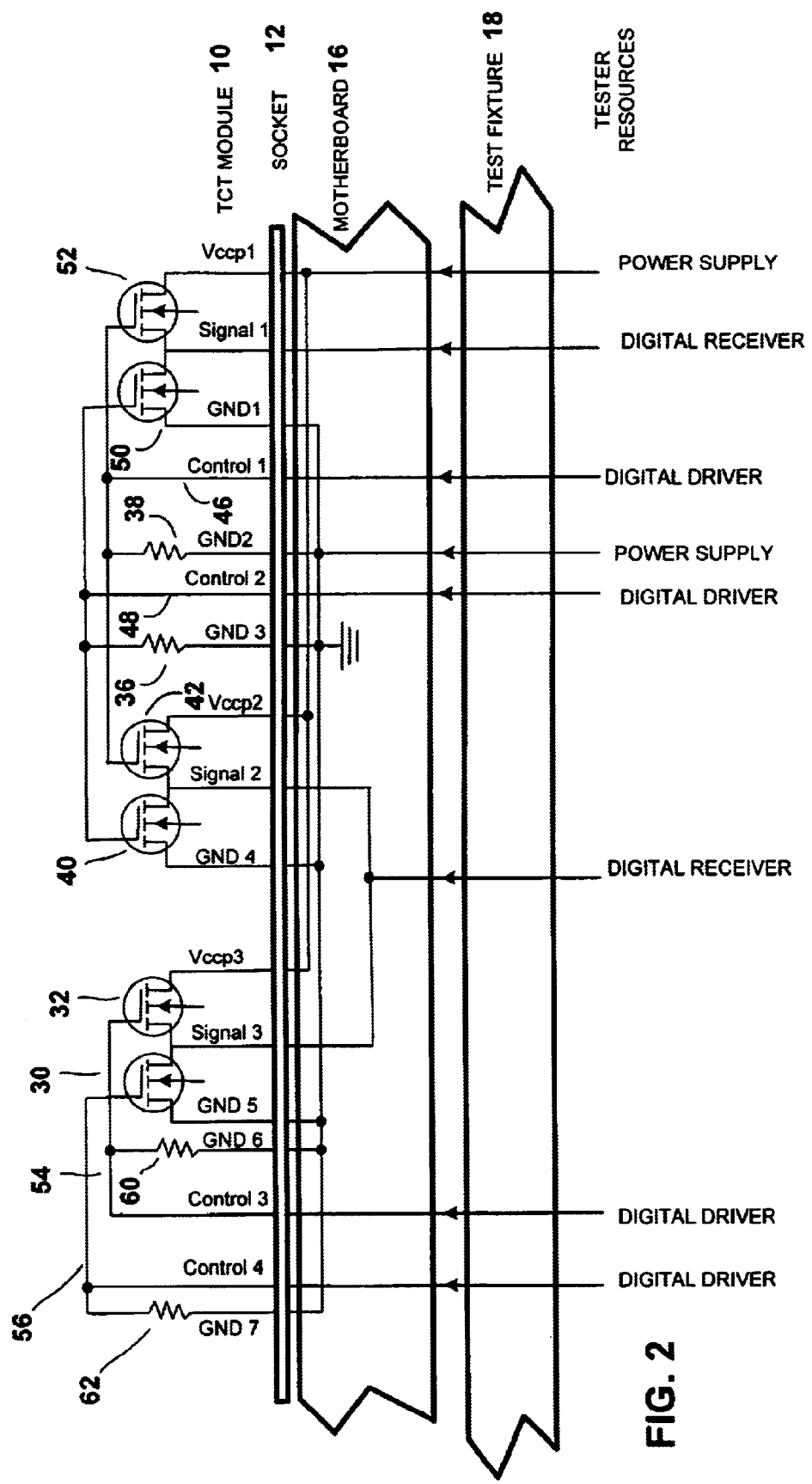
FIG. 2 is a schematic diagram of an in-circuit socket test system according to an example embodiment of the present invention.

FIG. 2 shows a schematic diagram of an in-circuit socket test system according to an example embodiment of the present invention. Test module 10 includes FET pair 30, 32, FET pair 40, 42 and FET pair 50, 52. Field effect transistors 30, 40 and 50 connect separate signal lines, signal 3, signal 2, and signal 1, respectively, to ground. Similarly, field effect transistors 32, 42 and 52 connect different signal lines, signal 3, signal 2, signal 1, respectively, to Vccp or power. A control line 46 (control1) controls FET 52 and 42 to either connect or disconnect their associated signal line (signal1, signal2 respectively) to power. A pull down resistor 38 may be connected to control line 46 to keep the control line from erroneously turning on (e.g., during power up). Similarly, a second control line 48 (control2) controls FETs 50 and 40 to connect or disconnect their associated signals (signal1, signal2 respectively) to ground. Second control line 48 may also have a pull down resistor 36 to prevent erroneous activation of control line 48.

Similarly, a third control line 54 (control3) and a fourth control line 56 (control4) control FET devices 32 and 30, respectively, to connect/disconnect the signal line signal3 to/from power or ground, respectively. Third control line 54 and fourth control line 56 may also have pull down resistors 60, 62, respectively.

Therefore, according to the present invention, multiple FET pairs may be used to connect all signal pins individually to independent power and ground pins. The gates of the FET devices that connect a signal line to power (high side FET) may be connected to a first control line pin and the gates of the FETs that connect a signal to ground (low side FET) may be connected to a second control line pin. When control pins for the high side FETs are driven high by test fixture 18, a continuity path should exist through the associated power pin, the high side FET, and back through the associated signal pin. If all pins were soldered properly, a digital high state would be measured on the signal pins when the control line activates the high side FET. When the control signals for the low side FETs are driven high by the tester 18, a continuity path should exist through the associated signal pin, the low side FET, and back through the associated ground pin. If all pins were soldered properly, a digital low state would be measured on the signal pins when the control line activates the low side FETs. The lack of the expected digital high state or digital low state signal transition indicates an open on either the signal pin, or the power/ground pin used by that FET pair.

Tester 18 may include digital drivers to drive the control signals through motherboard 16 and socket 12 to test module 10, as well as digital receivers connected to all signal lines to monitor the results of the testing. Tester 18 may have a monitor and input device for monitoring and controlling the testing. Further, tester 18 may include programs for automatic controlling and monitoring of testing of the socket.

According to the present invention, when individual signal pins are tied together on the printed circuit board, groups of FETs using independent control signals may be used to allow for verification of the individual signal pins. This situation exists with the signal pins feeding FET pair 30, 32 and FET pair 40, 42. Signal line signal3 from FET pair 30, 32 is tied together with signal line signal2 of FET pair 40, 42 on motherboard 16. However, since according to the present invention all signal lines may be isolated on test module 10, signal lines signal3 and signal2 can be verified using control signals 54 and 56 (control3 and control4) while signal line signal2 may be verified using control signals 46 and 48 (control1 and control2).

In designing test module 10, the motherboard design must be evaluated for pull-up/pull-down loads on signal pins of the socket. Signals with pull-ups may not be used to verify power pin connections. In these cases, the measured state of the signal pin would default to a high state. Signals with pull-downs may not be used to verify ground pin connections, as the signal pin would default to a low state. The layout and design of test module 10 must take these situations into account to ensure total power and ground pin coverage.

Figure 3:
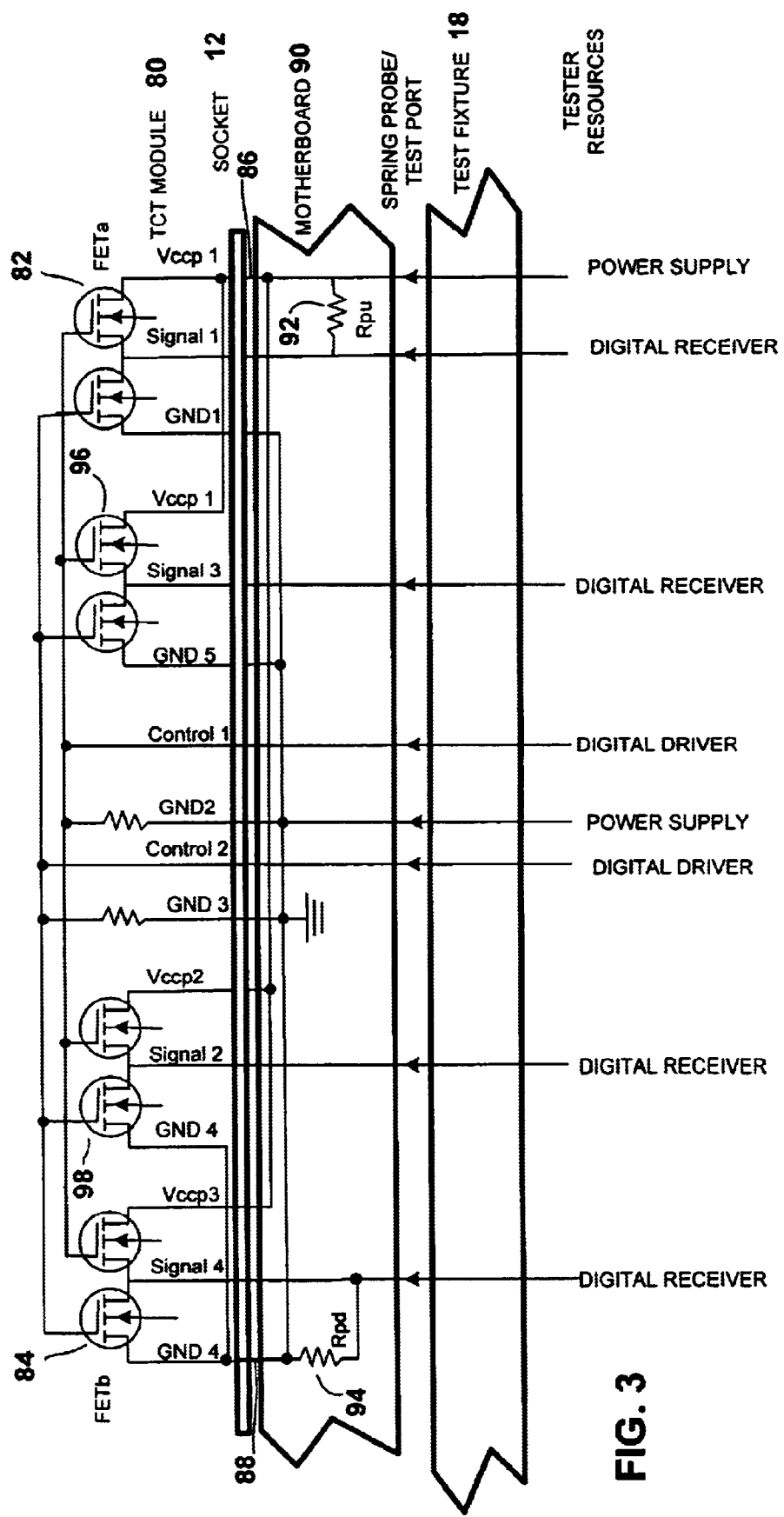
FIG. 3 is a schematic diagram of an in-circuit socket test system with pull-up and pull-down resistors according to an example embodiment of the present invention.

FIG. 3 shows a diagram of an in-circuit socket test system with pull-up and pull-down resistors according to an example embodiment of the present invention. In this embodiment, motherboard 90 includes a pull-up resistor 92 connected to signal line signal. Further, a pull-down resistor 94 is connected to signal line signal4 on motherboard 90. Pull-up resistor 92 prevents an open solder joint on the power pin 86 (Vccp1) from being detected using signal line signal 1. The measured state on signal line signal1 would be a high state by default. The solder joint on power pin 86 has to be verified through a different signal pin, e.g., signal line signal3 pin. This is possible since power from power pin 86 feeds both FET 82 and FET 96 (which ties signal line signal3 to power) on test module 80.

Similarly, pull-down resistor 94 prevents an open solder joint on the ground pin 88 (GND4) from being detected using signal line signal4. The measured state on signal line signal4 would be a low state by default. The solder joint for ground pin 88 would have to be verified through a different signal pin, e.g., signal line signal2 pin. This is possible since ground from ground pin 88 (GND4) is connected to both FET 84 and FET 88 (which ties signal line signal2 to ground) on test module 80.

Since the integrity of the solder joint on power pin 86 may be verified through signal line signal3, FET 82 may not be necessary and may be removed if size, or space limitations are a concern on test module 80. FET 84 may also be removed since ground pin 88 could be verified through signal line signal2 in the example embodiment shown.

Therefore, according to the present invention, if space is constrained on the test module, the high side FET may be eliminated on signals with dedicated pull-up loads and the low side FET may be eliminated on signals with dedicated pull-down loads.

As with most powered up digital in-circuit testing, it is desirable that all other active components on the motherboard be placed in a tri-state mode before testing. During testing, either a high side FET or a low side FET for a particular signal line is activated alone, and not both at the same time. Pull-down resistors may be connected to all control signals to ensure that the FETs are held in the off state when the tester drivers are turned off and other components are being tested. Each pull-down resistor may also be used to verify connectivity of a ground pin by connecting each resistor to ground through an isolated pin in the socket. In FIG. 2, the ground line signals GND2, GND3, GND6 and GND7 are shown as isolated ground pin connections that may be verified by measuring the resistance of pull-down resistors 38, 36, 60, 62, respectively. If the switching devices used are activated using a low state control line signal, then pull-up resistors may be used to prevent erroneous activation.

The present invention is advantageous for several reasons. The switching device pair design of a test module according to the present invention is such that all open connections may be detected on each signal pin, power pin, and ground pin of a socket. Further, a switching device pair design according to the present invention may enable manufactures with less capable test platforms to provide in-circuit testing of sockets. Boundary scan capability is not required to test the switching device pair design. A simple analog switching device test may be used to detect opens. Moreover, although surface mount technology, i.e., ball grid array, has been used to illustrate the present invention, the switching device pair design could easily be adapted to other types of sockets and connectors where a boundary scan device is not readily available, and/or testing of opens on all signal pins, ground pins, and power pins is not verifiable.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A system for in-circuit socket testing comprising:
   a module, the module containing at least two switching devices, the module electrically attachable to a socket;
   a printed circuit board, the printed circuit board containing a footprint for insertion of all pins of the socket; and
   a test fixture, the test fixture being electrically connected to all pins of the socket through the printed circuit board, the test fixture supplying power and ground to power pins and ground pins of the socket,
   wherein open connections to pins of the socket are detected by monitoring the pins after at least one of connecting a signal pin to a ground pin through one at least two switching devices and connecting a signal pin to a power pin through another at least two switching devices, and wherein the test fixture controls a first control signal and a second control signal, the first control signal controlling the one at least two switching devices to connect a signal pin to a around pin, the second control signal controlling the another at least two switching devices to connect the signal pin to a power pin.

2. The system according to claim 1, wherein the at least two switching devices comprise field-effect transistors (FETs).

3. The system according to claim 1, wherein the socket comprises one of a pinned grid array (PGA) and a ball grid array (BGA).

4. The system according to claim 1, wherein the printed circuit board includes test points, the test fixture being electrically connected to the pins of the socket through the test points on the printed circuit board.

* * * * *